United States Patent [19]

Engelbrecht

[11] Patent Number: 5,006,734

[45] Date of Patent: Apr. 9, 1991

[54] BIDIRECTIONAL CURRENT LIMITING CIRCUIT

[75] Inventor: Dennis R. Engelbrecht, Corvallis, Oreg.

[73] Assignee: Hewlett-Packard Company, Palo Alto, Calif.

[21] Appl. No.: 472,986

[22] Filed: Jan. 31, 1990

[51] Int. Cl.$^5$ .............................................. H03K 5/08
[52] U.S. Cl. ..................................... 307/544; 307/567
[58] Field of Search ............... 307/540, 542, 544, 557, 307/560, 562, 567

[56] References Cited

U.S. PATENT DOCUMENTS

| | | | |
|---|---|---|---|
| 4,345,171 | 8/1982 | Harris, Jr. ............................ | 307/544 |
| 4,382,198 | 5/1983 | Ishijima et al. ...................... | 307/560 |
| 4,744,369 | 5/1988 | Kroll ................................... | 307/544 |

Primary Examiner—John Zazworsky

[57] ABSTRACT

A two-port circuit for passing signal voltages while limiting the current that can flow in either direction. The circuit includes a first pair of bipolar transistors having their emitters directly coupled to a first node and their bases directly coupled to a second node. A resistor that carries the current is connected between the two nodes, in parallel with the base-emitter junctions of the transistor pair. A second transistor pair have their emitters coupled directly to the second node and diodes, oriented in opposite directions, coupled between their collectors and a third node. Each transistor pair includes an npn transistor and a pnp transistor. The current flows through the resistor and one of the transistors of the second pair, depending on the current's direction. A transistor of the first pair can turn on to control a transistor of the second pair to limit the current in either direction.

19 Claims, 1 Drawing Sheet

BIDIRECTIONAL CURRENT LIMITING CIRCUIT

BACKGROUND OF THE INVENTION

This invention relates to current limiting circuits. More particularly, this invention relates to a bidirectional current limiting circuit that limits current through the circuit in both directions.

The most popular electrical specification for asynchronous serial data communication is the RS-232C standard. The familiar 25-pin "D" connector found on the back of many computers and other devices is used with the standard. Developed long before integrated circuits, the RS-232C standard does not employ 5-volt and ground logic levels. Instead, it uses a positive voltage of between 3 and 15 V to represent a logic 0 and a negative voltage of between −3 and −15 V to represent a logic 1. In addition, RS-232C receivers must be able to withstand signal levels up to +/−25 V to assure compatibility with the older RS-232B standard.

Under the RS-232C standard, two devices connected together for serial communication are referred to as a piece of data terminal equipment (DTE) and a piece of data communications equipment (DCE). The DTE and DCE are connected pin-to-pin. The DTE transmits data on pin 2 (transmitted data) and receives data on pin 3 (received data). The DCE transmits on pin 3 (received data) and receives data on pin 2 (transmitted data). A device's designation as a DTE or DCE is not fixed. In one context a device may be a DTE while it may be a DCE in another.

Because of the pin designations, a problem may arise in serially connecting two devices. Typically the devices are not labeled as DTE and DCE and are connected by cable. If the user mistakenly connects a DTE to another DTE or incorrectly connects the cable to cause both the DTE and DCE to transmit on the same line, then the DTE may be faced with a +/−25 V signal applied to its transmitter circuit. Without protection against the resultant voltage and current overloads, the transmitter or the power supply of the DTE can be damaged.

A second problem is potential damage to the transmitter caused by a short circuit at its output. Such a condition might arise if pin 2 is accidentally shorted to ground. Without some means for limiting the current through the transmitter, the short circuit current may cause it to burn out.

Prior devices for limiting current have relied on the impedance of the output driver circuitry. However, this requires a large power supply to provide sufficient output current. Several RS-232 integrated circuit drivers such as the LT1080 from Linear Technology also use this approach of providing the protection and a large power supply. But such power is not available for battery-powered portable devices such as calculators, where such large power drains could cause memory loss of lock-up.

The present invention provides a solution to the drawbacks of the prior approach by limiting the current that can flow to and from the transmitter without requiring a high impedance output driver. The invention is not restricted to current control in portable devices, of course, but may be used wherever it is desirable to limit current flowing into and out of a device.

SUMMARY OF THE INVENTION

An object of the invention, therefore, is to provide a means for limiting current in both directions to a maximum desired magnitude.

Another object of the invention is to provide a low cost, simple circuit for doing so.

Another object of the invention is to provide such a circuit with precise control over the maximum current allowed.

Yet another object of the invention is to provide in a battery-powered device such a circuit that meets the RS-232C specifications for I/O protection.

To achieve these objects, a bidirectional current limiting circuit according to the invention includes a first pair of bipolar junction transistors, each transistor having its emitter coupled to a first node and its base coupled to a second node. A resistor for carrying the current to be limited is connected between the first node and a second node, in parallel with the base-emitter junction of a transistor of the transistor pair. Each transistor of a second pair is coupled to a second node and to a third node, one transistor including means for allowing current to flow from the third node through the transistor to the second node and the other transistor including means for allowing current to flow from the second node through the transistor to the third node. Each transistor of the first pair controls a transistor of the second pair to limit the current through the resistor when a controlling transistor turns on. A controlling transistor turns on if the current through the resistor in either direction reaches the desired maximum.

The foregoing and other objects, features, and advantages of the invention will become more apparent from the following detailed description of these and other preferred embodiments which proceeds with reference to the accompanying drawings.

BRIEF DESCRIPTION OF THE DRAWINGS

The sole FIGURE is bipolar transistor embodiment of a bidirectional current limiting circuit according to the invention.

DESCRIPTION OF A PREFERRED EMBODIMENT

Figure 1:
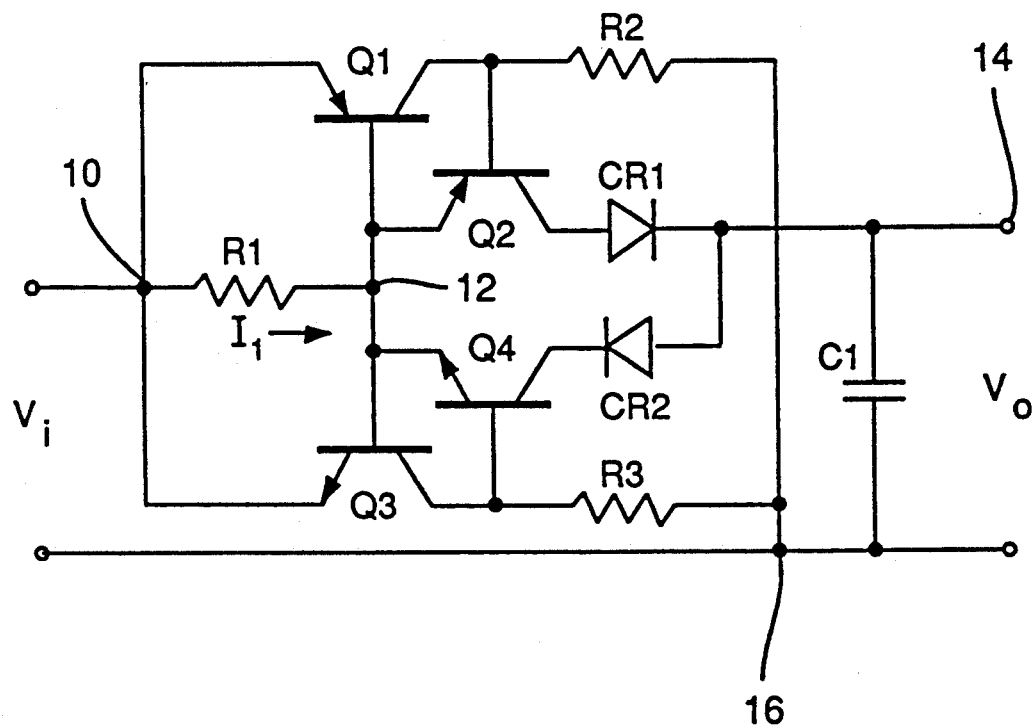

The sole FIGURE shows a bidirectional current limiting circuit according to the invention, configured for serial I/O protection for a battery-powered device. The present embodiment is based on bipolar transistors. At the left of the figure, Vi represents the voltage of serial data to be transmitted by the device's transmitter. Vi is applied to a first node 10, to which the emitters of a pair of bipolar transistors Q1 and Q3 are directly coupled. Q1 in the present embodiment is a pnp transistor and Q3 is an npn transistor. The bases of Q1 and Q3 are directly coupled to a second node 12. A resistive means such as resistor R1 is connected between the first and second nodes, in parallel with the base-emitter junctions of Q1 and Q3.

A second pair of bipolar transistors Q2 and Q4 have their emitters directly coupled to the second node 12. Q2 is a pnp transistor and has its base directly coupled to the collector of Q1. Q4 is an npn transistor and has its base directly coupled to the collector of Q3. Q2 has a diode CR1 coupled between the transistor's collector and a third node 14, at which appear the circuit's output voltage Vo and output current. CR1 is oriented to allow current (in the conventional sense) to flow from the first node through R1 and Q2 to the third node. Q4 has a diode CR2 coupled between the transistor's collector and the third node. CR2 is oriented in a direction opposite that of CR1 to allow current to flow from the third node 14 through Q4 and R1 to the first node. To bias Q2 and Q4, means such as resistors R2 and R3 are included. R2 is coupled at one end to the base of Q2 and the collector of Q1 and, at the other end, to signal ground. Similarly, R3 is coupled at one end to the base of Q4 and the collector of Q3 and, at the other end, to signal ground 16.

As described, one application of the present embodiment of the invention is for controlling currents in an RS-232C serial link. To meet output voltage slew specifications of that standard, a capacitor C1 is coupled between the third node 14 and signal ground to limit the slew rate of Vo.

In operation, the bidirectional current limiting circuit normally receives the input voltage Vi from the device's transmitter. The transmitter produces Vi in a serial waveform that varies between +4 and −34 V. The positive voltage represents logic 0 and the negative voltage represents logic 1. When Vi is positive, current in the circuit flows from transmitter through the first node 10, R1, Q2 and the third node 14 to a connected DCE. When Vi is negative, current flows in the opposite direction, from the DCE through the third node, Q4, R1 and the first node 10 into the transmitter. The current's return path in both cases is signal ground 16.

The current to be limited is shown as $I_1$ and flows through resistor R1, producing a voltage drop across it. So long as the resistor's voltage drop in either direction remains below the turn-on voltage Vbe of the base-emitter junctions of Q1 and Q3, these transistors remain off. In this circuit state, $I_1$, depending on its direction, will cause Q2 or Q4 to saturate. The voltage drop across the saturated transistor is about 0.2 V. Diodes CR1 and CR2 are preferably Shottkey diodes with a low voltage drop of about 0.3 V. The entire voltage drop from the first node to the third node is thus about 1 V when the current $I_1$ is less than the maximum desired. The resulting output voltage Vo at the third node 14 is about 3 V, which meets RS-232C specifications.

The maximum current $I_1$ that can flow through the circuit is limited by the actions of transistors Q1 and Q3. Resistor R1 is chosen so that maximum desired current Imax through it produces a voltage drop that is sufficient to turn on Q1 or Q3, whose base-emitter junctions are in parallel with the resistor:

$$I_1 = Vbe/R1 = Imax$$

For example, with a desired maximum of 4 mA and a transistor turn-on voltage of 0.6 V, R1 will have a resistance of 150 ohms. The resistance chosen, of course, varies with the desired maximum current.

If a transistor of the first pair Q1 and Q3 turns on, it controls the transistor of the second pair Q2 and Q4 to which it is connected to limit the current through the circuit. It does this by limiting the available base current to the controlled transistor, pulling it out of saturation into its active region. This change reduces the controlled transistor's demand for current. In this feedback mode, the impedance of transistors Q2 and Q4 increase dynamically, producing large voltage drops across these transistors. For example, assume a large reverse current is suddenly applied to the third node 14 because of a mistaken connection. Q4 is quickly driven into saturation and the current flows through R1 toward the first node. If the voltage across R1 exceeds about 0.6 V, Q3 turns on. Q3 immediately draws current through its collector, lowering the voltage at the node to which its collector, R3 and the base of Q4 are coupled. This change in voltage deprives Q4 of base current, pulling it out of saturation. Its impedance increases dynamically to absorb the increased voltage accompanying the reverse current. The feedback connection between Q3 and Q4 then maintains a sufficiently high impedance so long as Q3 is on. The same response occurs with Q1 and Q2 when more than the desired maximum current is attempting to flow out of the circuit. The circuit thus limits the current in both directions.

In the present embodiment, transistors Q1–Q4 have betas over 100 and resistors R2 and R3 are each 47 kilohms. These elements can, of course, have other values that will produce the desired current limiting.

OTHER EMBODIMENTS

As will be appreciated by those skilled in the art, the invention is not limited to a bipolar transistor embodiment. It may also be implemented equivalently with other types of transistors such as MOSFETs if so desired. As in the present embodiment, each transistor of a first pair would have one end of a pn junction coupled to the first node and its control means such as a gate or base coupled to a second node. A resistor would be connected between the first and second nodes, in parallel with pn junctions of the first pair. A second pair of transistors would be coupled to the second and third nodes, with means such a diode for controlling the direction of current through the second pair.

The present embodiment, however, offers some inherent advantages because of the nature of bipolar transistors. Transistors Q1 and Q3 protect each other against excessive voltages across their base-emitter junctions that otherwise might cause damage to the transistor. The reverse voltage across the base-emitter junction of Q1, for example, cannot exceed roughly 0.6 V because this will cause Q3 to turn on. Q1 similarly protects the base-emitter junction of Q3. In the same way, a transistors Q2 and Q4 protect each other. In the same way, the collector-base junctions of Q1 and Q3 protect the emitter-base junctions of Q2 and Q4, respectively.

Variations of the present embodiments are, of course, possible. For example, rather than coupling the transistors directly to the various nodes as shown and described, it may be desirable to couple them through other elements to the nodes. As another example, the second node may be two separate nodes, one connecting R1, Q1 and Q2, and the other connecting another resistor, Q3 and Q4. Functionally, R1 may be replaced with any type of device that produces a voltage proportional to the current flowing through it. R2 and R3 may be replaced with equivalent elements that would provide bias current to Q2 and Q4. Similarly, it is recognized that diodes CR1 and CR2 may be replaced with other rectification elements. Q1 and Q3 may be replaced with operational amplifiers. And any of the transistors may be replaced with compound devices such as Darlington or cascode-connected transistors. These variations are just some examples of equivalents to the present embodiment.

Having illustrated and described the principles of the invention in a preferred embodiment, it will be apparent to those skilled in the art that there can be many such equivalent variations of the present embodiment without departing from these principles. Therefore, the present embodiment is intended only as an example of the invention and not as a limitation on its scope. I intend to cover all such variations which come within the spirit and scope of the following claims that define the invention.

I claim:

1. A bidirectional current limiting circuit for limiting the current through the circuit to a maximum, comprising:

a first pair of bipolar junction transistors, each transistor having its emitter coupled to a first node and its base coupled to a second node;

resistance means for carrying the current to be limited, the resistance means connected between the first node and a second node, in parallel with the base-emitter junction of a transistor of the transistor pair; and a second pair of bipolar junction transistors, each transistor coupled to a second node and to a third node, one transistor including means for allowing current to flow from the third node through the transistor to the second node and the other transistor including means for allowing current to flow from the second node through the transistor to the third node, each transistor of the first pair controlling a transistor of the second pair to limit the current through the resistance means when a controlling transistor turns on, a controlling transistor turning on if the current through the resistance means in either direction reaches the maximum.

2. The circuit of claim 1 wherein the first and second transistor pairs are coupled to a single second node.

3. The circuit of claim 1 wherein the emitters of the first pair of transistors are coupled directly to the first node and the bases are coupled directly to the second node.

4. The circuit of claim 1 wherein the second pair of transistors are coupled directly to the second node.

5. The circuit of claim 1 wherein one transistor of the first pair is an npn transistor and the other transistor of the first pair is a pnp transistor.

6. The circuit of claim 1 including means for biasing a transistor of the second pair into saturation when the current through the resistance means is less than the maximum.

7. The circuit of claim 6 wherein the biasing means comprises a resistor coupled between the base of a transistor of the second pair and a signal ground.

8. The circuit of claim 1 wherein a transistor of the first pair has its collector coupled to the base of a transistor of the second to drive a transistor of the second pair into its active region when the current through the resistance means reaches the maximum.

9. The circuit of claim 1 wherein the second pair of transistors have their emitters coupled directly to the second node.

10. The circuit of claim 9 wherein one transistor of the second pair is an npn transistor and the other transistor of the second pair is a pnp transistor.

11. The circuit of claim 1 wherein a means for allowing the current to flow through a transistor of the second pair comprises a pn junction.

12. The circuit of claim 11 wherein the pn junction comprises a diode coupled between the collector of the transistor and the third node.

13. The circuit of claim 1 including a capacitor coupled between the third node and a signal ground for controlling the slew rate of voltage transmitted through the circuit.

14. The circuit of claim 1 wherein the resistance means comprises a resistor.

15. A bidirectional current limiting circuit for limiting the current through the circuit to a maximum, comprising:

a first pair of transistors, each transistor having a first end of a pn junction coupled to a first node and a second end of the pn junction coupled to a second node;

resistance means for carrying the current to be limited, the resistance means connected between the first and second nodes, in parallel with the pn junction of a transistor of the transistor pair; and a second pair of transistors, each transistor coupled to a second node and to a third node, one transistor including means for allowing current to flow from the third node through the transistor to the second node and the other transistor including means for allowing current to flow from second node through the transistor to the third node, each transistor of the first pair controlling a transistor of the second pair to limit the current through the resistance means when a controlling transistor turns on, a controlling transistor turning on if the current through the resistance means in either direction reaches the maximum.

16. The circuit of claim 15 wherein the transistors are bipolar transistors.

17. The circuit of claim 15 wherein the first ends of the pn junctions of the first pair of transistors are coupled directly to the first node and the second ends of the pn junctions are coupled directly to the second node.

18. The circuit of claim 15 wherein the first and second transistor pairs are coupled to a single second node.

19. A bidirectional current limiting circuit for limiting the current through the circuit to a maximum, comprising:

a first pair of bipolar junction transistors having their emitters coupled directly to a first node and their bases coupled directly to a second node;

a resistor (R1) for carrying the current to be limited, the resistor connected between the first and second nodes, in parallel with the base-emitter junctions of the transistor pair; and a second pair of bipolar junction transistors having their emitters coupled directly to the second node, one transistor having a diode coupled to its collector for allowing current to flow from a third node through the transistor to the second node and the other transistor having a diode coupled to its collector for allowing current to flow from the transistor to the third node, a transistor of the first pair having its collector coupled to the base of a transistor of the second pair to control the transistor of the second pair and thereby limit the current through the resistor when the transistor of the first pair turns on, a transistor of the first pair turning on if the current through the resistor in either direction reaches the maximum.

* * * * *